United States Patent
He et al.

(10) Patent No.: US 9,030,816 B2
(45) Date of Patent: May 12, 2015

(54) MOUNTING APPARATUS FOR FAN

(71) Applicant: Zhongshan Innocloud Intellectual Property Services Co., Ltd., Zhongshan (CN)

(72) Inventors: Yu-Wei He, Shenzhen (CN); Xiu-Quan Hu, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 58 days.

(21) Appl. No.: 13/710,342

(22) Filed: Dec. 10, 2012

(65) Prior Publication Data

US 2013/0256501 A1  Oct. 3, 2013

(30) Foreign Application Priority Data

Apr. 3, 2012  (CN) .......................... 2012 1 0095711

(51) Int. Cl.
  G06F 1/20  (2006.01)
  H05K 5/00  (2006.01)
  H05K 7/20  (2006.01)

(52) U.S. Cl.
  CPC .............. H05K 7/20 (2013.01); H05K 7/20172 (2013.01)

(58) Field of Classification Search
  USPC ................ 361/679.48, 679.47, 695; 248/674; 415/213.1
  See application file for complete search history.

(56) References Cited

U.S. PATENT DOCUMENTS

| | | | |
|---|---|---|---|
| 6,556,437 B1 * | 4/2003 | Hardin | 361/679.48 |
| 6,674,641 B2 * | 1/2004 | Jensen et al. | 361/679.48 |
| 6,827,549 B1 * | 12/2004 | Horng et al. | 415/68 |
| 6,865,078 B1 * | 3/2005 | Chang | 361/695 |
| 7,031,157 B2 * | 4/2006 | Horng et al. | 361/695 |
| 7,583,498 B2 * | 9/2009 | Chen et al. | 361/679.48 |
| 7,641,443 B2 * | 1/2010 | Chuang | 415/213.1 |
| 7,729,123 B2 * | 6/2010 | Zhao et al. | 361/719 |
| 7,839,638 B2 * | 11/2010 | Ye et al. | 361/695 |
| 8,373,989 B2 * | 2/2013 | Gong et al. | 361/695 |
| 8,608,438 B2 * | 12/2013 | Shu | 415/213.1 |
| 8,684,688 B2 * | 4/2014 | Wu et al. | 415/213.1 |
| 2007/0035924 A1 * | 2/2007 | Westphall et al. | 361/687 |
| 2007/0237625 A1 * | 10/2007 | Liang | 415/119 |
| 2009/0040714 A1 * | 2/2009 | Yamada et al. | 361/687 |
| 2009/0284919 A1 * | 11/2009 | Tao et al. | 361/695 |
| 2010/0329860 A1 * | 12/2010 | Li | 415/213.1 |
| 2011/0067836 A1 * | 3/2011 | Tang et al. | 165/67 |
| 2011/0157817 A1 * | 6/2011 | Li | 361/679.48 |
| 2012/0076649 A1 * | 3/2012 | Ye | 415/213.1 |

* cited by examiner

*Primary Examiner* — Terrell McKinnon
*Assistant Examiner* — Michael McDuffie
(74) *Attorney, Agent, or Firm* — Novak Druce Connolly Bove + Quigg LLP

(57) ABSTRACT

A mounting apparatus includes a mounting member and a cage configured for receiving a fan. The cage includes two side plates. Each of the two side plates defines a pair of first locking openings. The mounting member includes a body and two first mounting portions extending from each of two opposite sides of the body. The two first mounting portions engage in the first locking openings of the two side plates to secure the mounting member to the cage, for preventing the fan from moving out of the cage.

19 Claims, 4 Drawing Sheets

MOUNTING APPARATUS FOR FAN

BACKGROUND

1. Technical Field

The present disclosure relates to mounting apparatuses, more particularly to a mounting apparatus for a fan.

2. Description of Related Art

A fan in a chassis of a computer system dissipates heat generated from electronic components of the computer system. However, the fan must be directly secured to the chassis with screws.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

Figure 1:
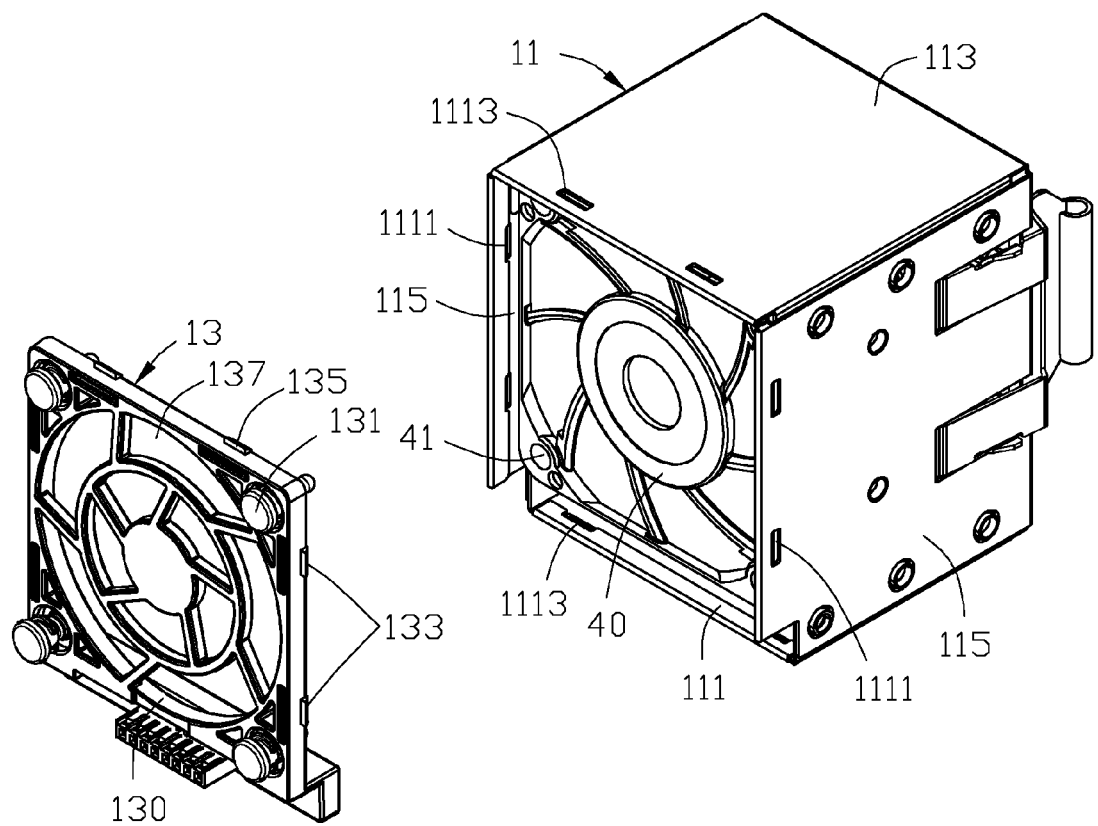
FIG. 1 is an exploded, isometric view of a mounting apparatus and a first fan in accordance with an embodiment.
Figure 2:
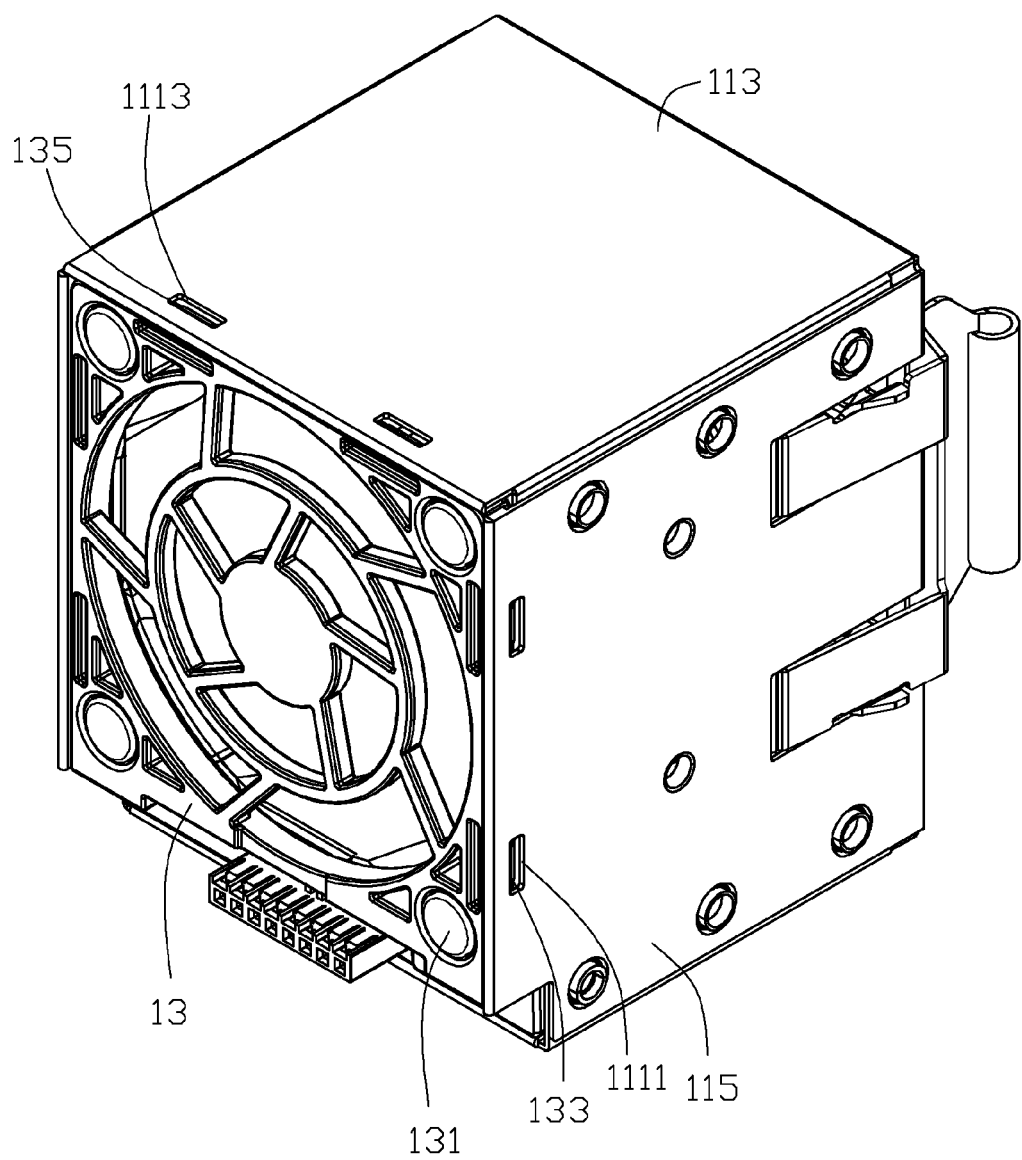
FIG. 2 is an assembled view of the mounting apparatus and the first fan of FIG. 1.

FIG. 1 illustrates a mounting apparatus for a first fan 40 in one embodiment. The first fan 40 defines a plurality of first securing holes 41. The mounting apparatus comprises a cage 11 and a mounting member 13. The first fan 40 is secured in the cage 11. The cage 11 includes two side plates 115. Each of the two side plates 115 defines two first locking openings 1111. The mounting member 13 comprises a body 130 and four first mounting portions 133, extending from opposite sides of the body 130. Referring to FIG. 2, the four first mounting portions 133 engage the first locking openings 1111, of the two side plates 115, to secure the mounting member 13 to the cage 11, for locking the first fan 40 in place in the cage 11. In an embodiment, the two side plates 115 are substantially parallel to each other.

The cage 11 further comprises a top plate 113 and a bottom plate 111, opposite to the top plate 113. The top plate 113 and the bottom plate 111 are connected to the two side plates 115. Each of the top plate 113 and the bottom plate 111 defines two second locking openings 1113. Four second mounting portions 135 extend from a top side and a bottom side of the body 130 of the mounting member 13. The four second mounting portions 135 engage in the second locking openings 1113 of the top plate 113 and the bottom plate 111. In an embodiment, the top plate 113 is substantially parallel to the bottom plate 111, and the top plate 113 and the bottom plate 111 are substantially perpendicular to the two side plates 115.

The top plate 113 is deformable. When the mounting member 13 is inserted into the cage 11, the two second mounting portions 135 push the top plate 113 away, resiliently deforming the top plate 113, until the two second mounting portions 135 snap into the two second locking openings 1113 of the top plate 113. The top plate 113 engages the two second mounting portions 135 in the two second locking openings 1113. The two side plates are resiliently deformable. When the mounting member 13 is inserted into the cage 11, the four first mounting portions 133 push the two side plates 115 away, resiliently deforming the two side plates 115, until the four first mounting portions 133 snap into the four first locking openings 1111, of the two side plates 115. The two side plates 115 firmly engage the four first mounting portions 133 in the four first locking openings 1111.

The body 130 of the mounting member 13 defines a plurality of ventilation holes 137. When the first fan 40 works, cooling air flows through the plurality of ventilation holes 137 and the cage 11. A plurality of fasteners 131 is secured to the body 130 of the mounting member 13. Referring to FIG. 2, the fasteners 131 are secured in the first securing holes 41.

Figure 3:
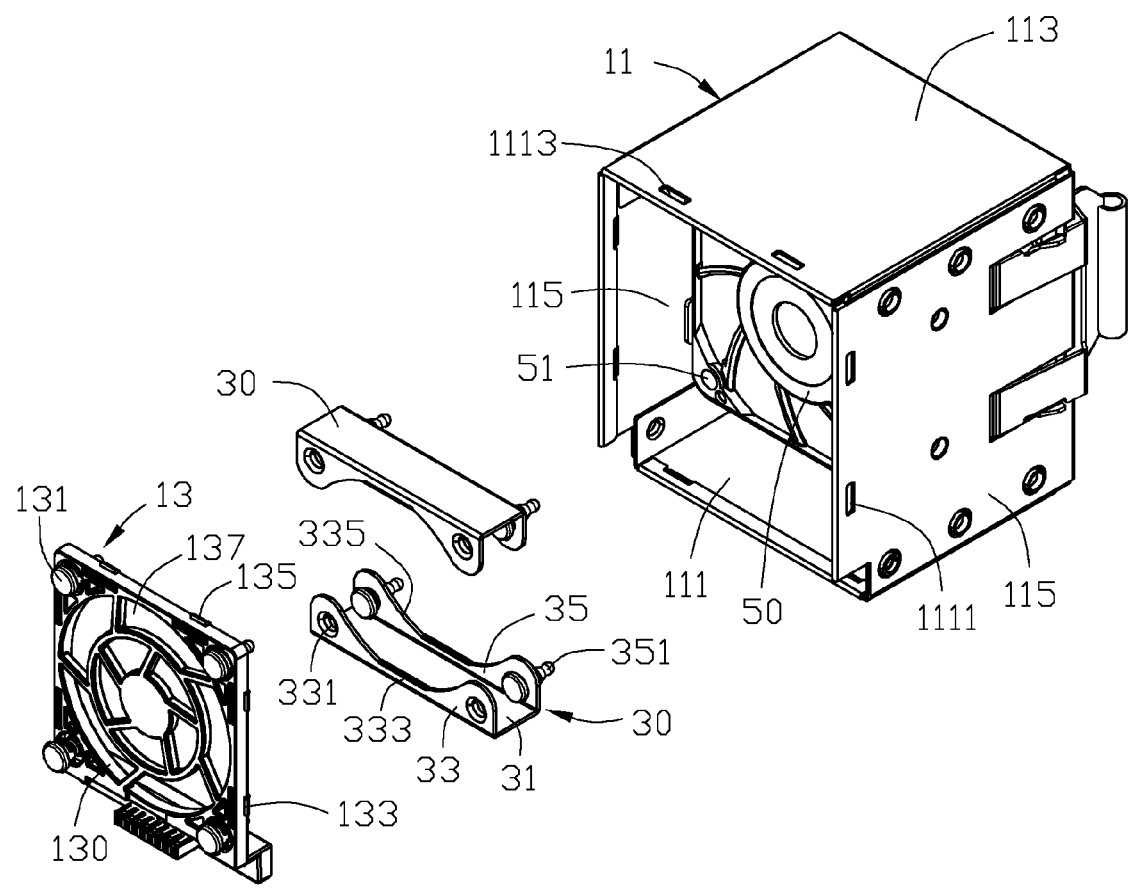
FIG. 3 is an exploded, isometric view of a mounting apparatus and a second fan in accordance with another embodiment.
Figure 4:
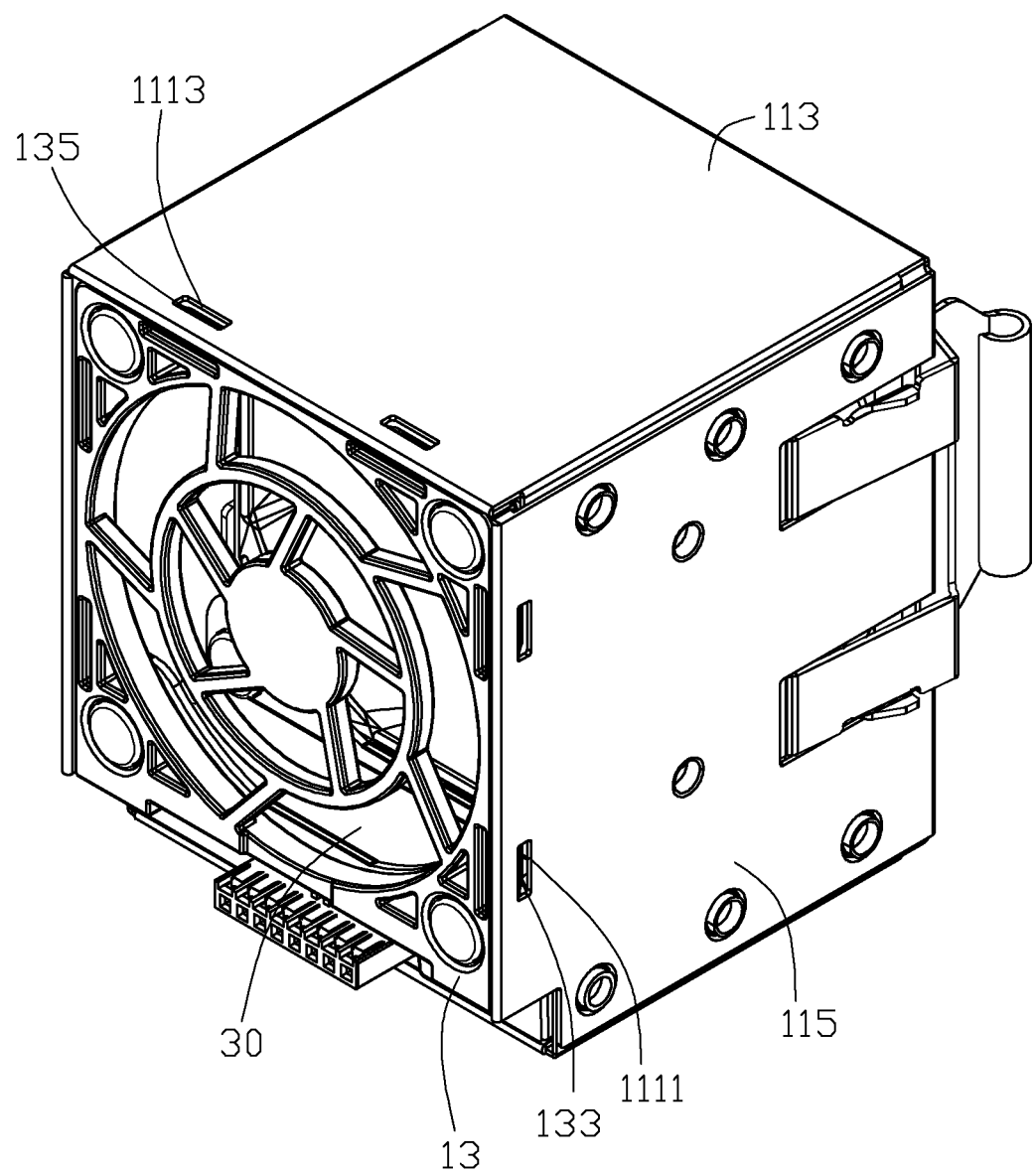
FIG. 4 is an assembled view of the mounting apparatus and the second fan of FIG. 3.

Referring to FIG. 3, in another embodiment, the mounting apparatus further includes two positioning members 30. The cage 11 can receive a second fan 50. A height of the second fan 50 is less than that of the first fan 40. The second fan 50 further includes a plurality of second securing holes 51. The two positioning members 30 are secured to the second fan 50 and located in the cage 11 between the two side plates 115.

Each of the two positioning members 30 comprises a base wall 31, a first sidewall 35, and a second sidewall 33. The first sidewall 35 and the second sidewall 33 extend from opposite edges of the base wall 31. The first sidewall 35 is secured to the second fan 50. The second sidewall 33 is secured to the body 130 of the mounting member 13. In an embodiment, the first sidewall 35 is substantially parallel to the second sidewall 33, and perpendicular to the base wall 31.

Two shock absorbing members 351 are secured to the first sidewall 35 of each of the two positioning members 30, and the two shock absorbing members 351 can be secured to the second securing holes 51 of the second fan 50. The second sidewall 33, of each of the two positioning members 30, defines two fixing holes 331. The plurality of fasteners 131 is fixed in the fixing holes 331 of the two positioning members 30. Each of the two positioning members 30 comprises an arcuate cutout 333. The cutouts 333 of the two positioning members 30 together define a circular hole, when the two positioning members 30 are secured in the cage 11. The two positioning members 30 are located between the mounting member 13 and the second fan 50.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus comprising:
  a cage configured for receiving a fan, the cage comprising two side plates, each of the two side plates defining a first locking opening;
  a mounting member, the mounting member comprising a body and two first mounting portions, extending from two opposite sides of the body; and the two first mounting portions engaged in the first locking openings of the two side plates to secure the mounting member to the cage; and a positioning member received in the case and comprising a first sidewall and a second sidewall coupled to the first sidewall, the first sidewall being secured to the body, the second sidewall being secured to the fan and substantially parallel to the first sidewall.

2. The mounting apparatus of claim 1, wherein the two side plates are substantially parallel to each other.

3. The mounting apparatus of claim 1, wherein the cage further comprises a top plate and a bottom plate, that is opposite to the top plate; the top plate and the bottom plate are connected to the two side plates, and each of the top plate and the bottom plate defines a second locking opening; two second mounting portions extend from another two opposite sides of the mounting member; and each of the two second mounting portions are engaged in the second locking opening of each of the top plate and the bottom plate.

4. The mounting apparatus of claim 3, wherein the top plate is substantially parallel to the bottom plate.

5. The mounting apparatus of claim 4, wherein the top plate and the bottom plate are substantially perpendicular to the two side plates.

6. The mounting apparatus of claim 2, wherein the positioning member comprises a base wall, the first sidewall and the second sidewall extend from two opposite edges of the base wall, and the first sidewall and the second sidewall are substantially perpendicular to the base wall and the two side plates.

7. The mounting apparatus of claim 6, wherein a shock absorbing member is secured to the first sidewall, and the shock absorbing member is configured to be secured to the fan.

8. A mounting apparatus comprising: a cage configured for receiving a fan, the cage comprising two side plates, each of the two side plates defining a first locking opening; a mounting member, the mounting member comprising a body and two first mounting portions extending from two opposite sides of the body, and the two first mounting portions are engaged in the first locking openings, of the two side plates, to secure the mounting member to the cage; and a positioning member configured for being secured to the fan, the positioning member received in the cage between the two side plates the fan and the body; wherein the mounting member prevents the positioning member from moving out of the cage, wherein the positioning member comprises a base wall, a first sidewall, and a second sidewall; the first sidewall and the second sidewall extends extend from two opposite edges of the base wall; the first sidewall configured to be secured to the fan; and the second sidewall secured to the mounting member.

9. The mounting apparatus of claim 8, wherein the two side plates are substantially parallel to each other.

10. The mounting apparatus of claim 8, wherein the cage further comprises a top plate and a bottom plate, opposite to the top plate; the top plate and the bottom plate are connected to the two side plates, and each of the top plate and the bottom plate defines a second locking opening; two second mounting portions extend from another two opposite sides of the mounting member; and the two second mounting portions are engaged in the second locking openings of the top plate and the bottom plate.

11. The mounting apparatus of claim 10, wherein the top plate is substantially parallel to the bottom plate.

12. The mounting apparatus of claim 11, wherein the top plate and the bottom plate are substantially perpendicular to the two side plates.

13. The mounting apparatus of claim 10, wherein the top plate is resiliently deformable to engage the two second mounting portions in the second locking opening of the top plate.

14. The mounting apparatus of claim 8, wherein the two side plates are resiliently deformable, to engage the two first mounting portions in the first locking openings of the two side plates.

15. The mounting apparatus of claim 8, wherein the first sidewall is substantially parallel to the second sidewall and perpendicular to the base wall.

16. The mounting apparatus of claim 8, wherein a shock absorbing member is secured to the first sidewall, and the shock absorbing member is configured to be secured to the fan.

17. The mounting apparatus of claim 8, wherein the second sidewall defines a fixing hole, a fastener is secured to the body of the mounting member, and the fastener is fixed in the fixing hole.

18. The mounting apparatus of claim 8, wherein the body of the mounting member defines a plurality of ventilation holes.

19. A mounting apparatus comprising:
a cage configured for receiving a fan, the cage comprising two side plates, each of the two side plates defining a first locking opening;
a mounting member, the mounting member comprising a body and two first mounting portions extending from two opposite sides of the body, and the two first mounting portions are engaged in the first locking openings, of the two side plates, to secure the mounting member to the cage; and
a positioning member configured for being secured to the fan, the positioning member located in the cage between the two side plates;
wherein the mounting member prevents the positioning member from moving out of the cage; and
the positioning member comprises a base wall, a first sidewall, and a second sidewall; the first sidewall and the second sidewall extends from two opposite edges of the base wall; the first sidewall configured to be secured to the fan; and the second sidewall secured to the mounting member.

* * * * *